US012620550B2

(12) United States Patent
Severi et al.

(10) Patent No.: US 12,620,550 B2
(45) Date of Patent: May 5, 2026

(54) METHOD OF PERFORMING METROLOGY ON A MICROFABRICATION PATTERN

(71) Applicants: IMEC VZW, Leuven (BE); Katholieke Universiteit Leuven, Leuven (BE)

(72) Inventors: Joren Severi, Leuven (BE); Gian Francesco Lorusso, Overijse (BE); Danilo De Simone, Leuven (BE)

(73) Assignees: Imec vzw, Leuven (BE); Katholieke Universiteit Leuven, Leuven (BE)

( * ) Notice: Subject to any disclaimer, the term of this patent is extended or adjusted under 35 U.S.C. 154(b) by 409 days.

(21) Appl. No.: 18/184,366

(22) Filed: Mar. 15, 2023

(65) Prior Publication Data

US 2023/0298854 A1 Sep. 21, 2023

(30) Foreign Application Priority Data

Mar. 16, 2022 (EP) ..................................... 22162539

(51) Int. Cl.
*H01J 37/28* (2006.01)
*G06T 7/00* (2017.01)

(52) U.S. Cl.
CPC .............. *H01J 37/28* (2013.01); *G06T 7/001* (2013.01); *G06T 2207/30148* (2013.01); *H01J 2237/2817* (2013.01)

(58) Field of Classification Search
CPC ... H01J 37/28; H01J 2237/2817; G06T 7/001; G06T 2207/30148
See application file for complete search history.

(56) References Cited

U.S. PATENT DOCUMENTS

| | | | | |
|---|---|---|---|---|
| 5,242,831 | A * | 9/1993 | Oki ........................... | G01N 1/32 |
| | | | | 73/104 |
| 7,230,723 | B2 * | 6/2007 | Yamaguchi ........ | G01N 23/2251 |
| | | | | 356/600 |
| 10,176,966 | B1 * | 1/2019 | Mack ....................... | H01J 37/28 |
| 10,663,416 | B2 * | 5/2020 | Fukuda ................. | H01J 37/222 |
| 10,664,955 | B2 * | 5/2020 | Mack ........................ | G06T 5/60 |

(Continued)

OTHER PUBLICATIONS

European Search Report and Search Opinion, Application No. EP 22162539.5, mailed Sep. 2, 2022, 11 pages.

(Continued)

*Primary Examiner* — Wyatt A Stoffa
(74) *Attorney, Agent, or Firm* — McDonnell Boehnen Hulbert & Berghoff LLP

(57) ABSTRACT

A method includes generating, by a SEM, sets of frames corresponding to regions of a microfabrication pattern, for each set of frames, estimating feature data representing edge positions, linewidths, or centerline positions of one or more features of each region of the pattern, and computing a preliminary estimate of a roughness parameter from the feature data. The roughness parameter is indicative of a line edge roughness, a linewidth roughness, or a pattern placement roughness of the one or more features. The method further includes fitting a model equation to the preliminary estimates of the roughness parameter using a model parameter dependent on the number of frames of each set of frames, the model equation relating the model parameter to the roughness parameter; and computing a final estimate of the roughness parameter as an asymptotic value of the fitted model equation.

20 Claims, 5 Drawing Sheets

200

S202
Generate set of frames $S_i$ of region $R_i$ of the pattern

S204
Receive set of frames $S_i$

S205
Generate images $I_i$

S206
For each set of frames $S_i$ or image $I_i$:

S206a
Estimate feature data

S206b
Compute preliminary estimate of roughness parameter

S208
Fit model equation

S210
Compute final estimate of roughness parameter

(56) References Cited

U.S. PATENT DOCUMENTS

| | | | | |
|---|---|---|---|---|
| 12,142,454 | B2 * | 11/2024 | Mack | H01J 37/28 |
| 2003/0021463 | A1 * | 1/2003 | Yamaguchi | G01N 21/95684 |
| | | | | 382/145 |
| 2005/0211897 | A1 * | 9/2005 | Sasajima | H01J 37/28 |
| | | | | 250/311 |
| 2006/0145076 | A1 * | 7/2006 | Yamaguchi | G01N 23/2251 |
| | | | | 250/310 |
| 2009/0114816 | A1 * | 5/2009 | Tam | G06T 7/0004 |
| | | | | 250/311 |
| 2009/0206255 | A1 * | 8/2009 | Saito | G01N 23/2251 |
| | | | | 250/310 |
| 2016/0035538 | A1 * | 2/2016 | Fukuda | H01J 37/285 |
| | | | | 250/307 |
| 2019/0113338 | A1 | 4/2019 | Mack | |
| 2019/0120777 | A1 * | 4/2019 | Fukuda | G01N 23/2251 |
| 2019/0272623 | A1 * | 9/2019 | Mack | G06T 5/60 |
| 2023/0245444 | A1 * | 8/2023 | Brockers | G06T 17/05 |
| | | | | 348/144 |

OTHER PUBLICATIONS

Fukuda, Hiroshi, Takahiro Kawasaki, Hiroki Kawada, Kei Sakai, Takashi Kato, Satoru Yamaguchi, Masami Ikota, and Yoshinori Momonoi. "Measurement of pattern roughness and local size variation using CD-SEM: current status." In Metrology, Inspection, and Process Control for Microlithography XXXII, vol. 10585, pp. 70-80. SPIE, 2018.

Levi, Shimon, Ishai Schwarzband, Roman Kris, Ofer Adan, Elly Shi, Ying Zhang, and Kevin Zhou. "Edge roughness characterization of advanced patterning processes using power spectral density analysis (PSD)." In Advanced Etch Technology for Nanopatterning V, vol. 9782, pp. 30-38. SPIE, 2016.

Lorusso, Gian F., Vito Rutigliani, Frieda Van Roey, and Chris A. Mack. "Unbiased roughness measurements: Subtracting out SEM effects, part 2." Journal of Vacuum Science & Technology B, Nanotechnology and Microelectronics: Materials, Processing, Measurement, and Phenomena 36, No. 6 (2018): 06J503.

Villarrubia, John S., and B. D. Bunday. "Unbiased estimation of linewidth roughness." In Metrology, Inspection, and Process Control for Microlithography XIX, vol. 5752, pp. 480-488. SPIE, 2005.

Constantoudis, Vassilios, George P. Patsis, Leonardus Hendrikus Albertino Leunissen, and Evangelos Gogolides. "Toward a complete description of linewidth roughness: a comparison of different methods for vertical and spatial LER and LWR analysis and CD variation." In Metrology, Inspection, and Process Control for Microlithography XVIII, vol. 5375, pp. 967-977. SPIE, 2004.

* cited by examiner

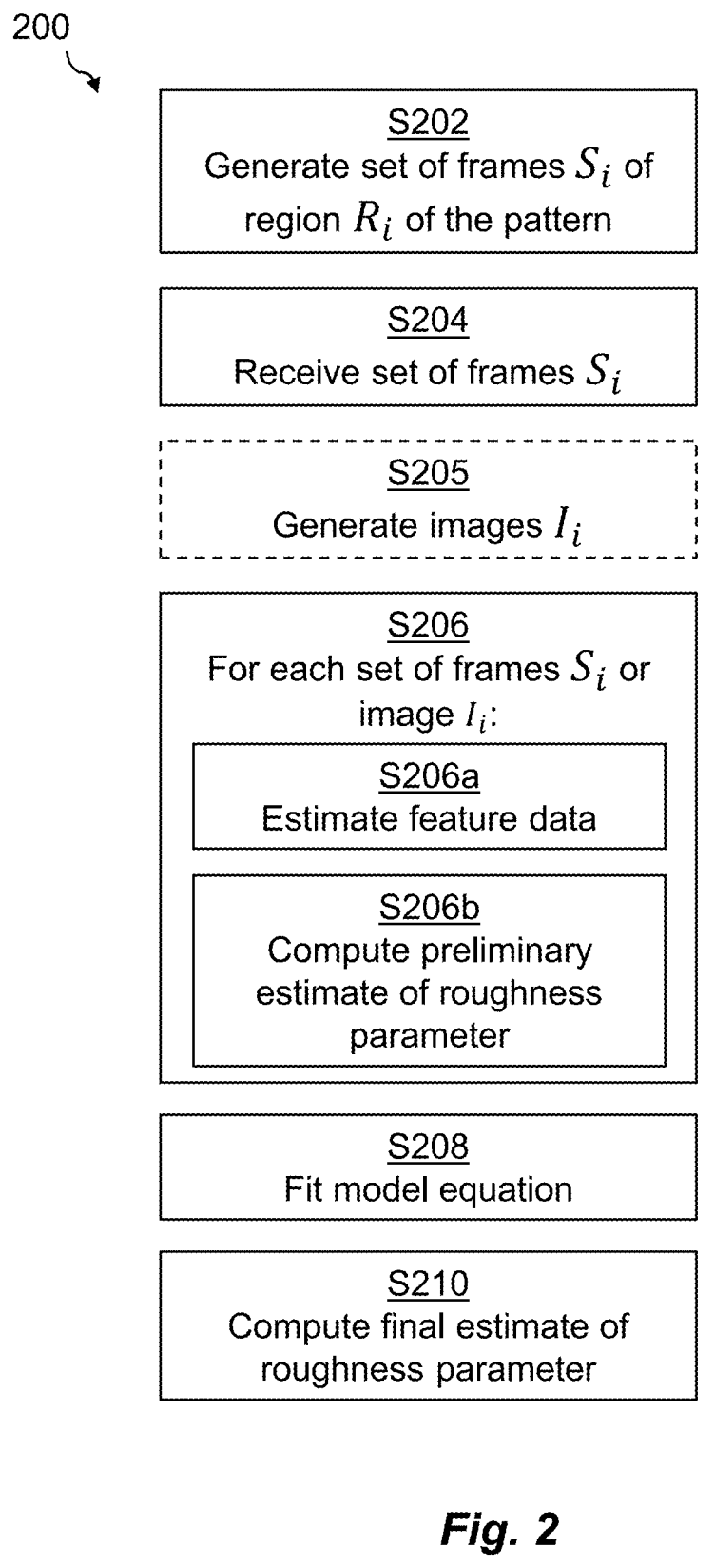

200

S202
Generate set of frames $S_i$ of region $R_i$ of the pattern

S204
Receive set of frames $S_i$

S205
Generate images $I_i$

S206
For each set of frames $S_i$ or image $I_i$:

S206a
Estimate feature data

S206b
Compute preliminary estimate of roughness parameter

S208
Fit model equation

S210
Compute final estimate of roughness parameter

*Fig. 2*

METHOD OF PERFORMING METROLOGY ON A MICROFABRICATION PATTERN

CROSS-REFERENCE TO RELATED APPLICATIONS

The present application is a non-provisional patent application claiming priority to European Patent Application No. 22162539.5, filed on Mar. 16, 2022, the contents of which are hereby incorporated by reference.

FIELD OF THE DISCLOSURE

The present disclosure relates to a method of performing metrology on a microfabrication pattern, and further to a computer-readable media configured to implement a corresponding method.

BACKGROUND

Over the past decades, integrated circuits have seen a continuous increase of computing power by including increasing numbers of transistors per unit area. The semiconductor industry has witnessed the transition from contact and proximity printing in the 1970s to a range of projection lithography techniques. The drastic resolution improvement in projection lithography has been enabled by three main factors: (1) the reduction of imaging source wavelength $\lambda$, (2) the increase in the lens numerical aperture (NA), and (3) the reduction of the process-related $k_1$-factor, that are summarized in the Rayleigh equation:

$$CD = k_1 \frac{\lambda}{NA}$$

Today, state of the art technology nodes rely on Extreme Ultraviolet Lithography (EUVL). The transition to shorter source wavelengths has entailed a continuous downscaling of the resist film thickness, e.g. to limit aspect ratios (i.e., resist height-to-width) in resist patterns when progressing to smaller feature sizes. High aspect ratios may otherwise lead to pattern collapse e.g. during the rinse process.

The further development of EUVL involves transitioning from 0.33 NA to 0.55 NA, i.e. high-NA EUVL. A higher NA allows capturing higher diffractive orders which allows printing of even smaller feature sizes. With the transition to high-NA EUVL, again a reduction in resist film thickness (FT) is expected to avoid large aspect ratios. However, an additional reason is also given by a second Rayleigh equation which shows that the depth-of-focus (DoF) scales inversely with the quadratic of NA:

$$DoF = k_2 \frac{\lambda}{NA^2}$$

The DoF gives the focus range that can be tolerated during the exposure. As a consequence, a reduced DoF will limit the range (and thus also the FT) over which the exposure contrast is high enough to deliver a good resist patterning performance.

SUMMARY

As realized by the inventors, the continuing reduction in resist FT will bring along associated challenges related to metrology. In particular, it is envisaged that a reduced FT will reduce the signal-to-noise ratio (SNR) of images obtained using e-beam based metrology, such as Critical Dimension Scanning Electron Microscopes (CDSEM). A lower SNR may in turn hinder accurate estimation of pattern roughness parameters, e.g. line-edge roughness (LER) or linewidth roughness (LWR), which are indicative of resist pattern performance.

In light of the above, the disclosure includes a method of performing metrology on a microfabrication pattern, enabling accurate metrology on patterns in thin FT resists, and, more generally, on microfabrication patterns yielding low SNR.

According to a first aspect there is provided a method of performing metrology on a microfabrication pattern, the method comprising:

generating, by a scanning electron microscope (SEM), a first set of frames of a first region of the pattern, a second set of frames of a second region of the pattern, and a third set of frames of a third region of the pattern, wherein a number of frames of the first, second, and third sets of frames are different;

for each of the first, second, and third set of frames, by a computing device:

estimating feature data representing edge positions, linewidths, or centerline positions of one or more features of the region of the pattern of the set of frames (i.e. the region of the pattern represented/depicted by the set of frames), and computing a preliminary estimate of a roughness parameter from the feature data, wherein the roughness parameter is indicative of a line edge roughness, a linewidth roughness, or a pattern placement roughness of the one or more features;

wherein the method further comprises, by the computing device:

fitting a model equation to the preliminary estimates of the roughness parameter and a model parameter dependent on the number of frames of the set of frames, the model equation relating the model parameter to the roughness parameter; and computing a final estimate of the roughness parameter as an asymptotic value of the fitted model equation.

According to a second aspect there is provided a non-transitory computer-readable media comprising instructions configured to, when executed by a computing device, cause the computing device to perform a method comprising, for each of a first, second, and third set of frames of a first, second, and third region of a microfabrication pattern, respectively, wherein the first, second, and third set of frames are generated by a scanning electron microscope (SEM), and wherein a number of frames of the first, second, and third sets of frames are different:

estimating feature data representing edge positions, linewidths, or centerline positions of one or more features of the region of the pattern of the set of frames (i.e. the region of the pattern represented/depicted by the set of frames), and computing a preliminary estimate of a roughness parameter from the feature data, wherein the roughness parameter is indicative of a line edge roughness, a linewidth roughness, or a pattern placement roughness of the one or more features;

wherein the method further comprises:

fitting a model equation to the preliminary estimates of the roughness parameter and a model parameter dependent on the number of frames of the set of frames, the model equation relating the model parameter to the roughness parameter; and computing a final estimate of the roughness parameter as an asymptotic value of the fitted model equation.

In the following, a respective set of frames i (e.g. the first, second, or third set of frames) may be denoted as $S_{i=1,2,3}, \ldots$ with $S_i=\{F_{i,1}, F_{i,2}, \ldots, F_{i,nbr_i}\}$, wherein $F_{i,j}$ denotes frame j of the set of frames i, and $nbr_i$ is the total number of frames of the set of frames i. It is to be noted that the various indices (e.g. i and j) and designations "first," "second," "third," etc. (e.g. in relation to a set of frames) are mere labels/identifiers to facilitate referencing to the individual elements (e.g. frames or sets) and do not imply generation/acquisition in any particular temporal order.

As used herein, the term "frame" ($F_{i,j}$) denotes a single (image) frame of a region of the pattern (e.g. first, second, or third region) generated by the SEM. A set of frames of a region (i.e. the same region) may be integrated/averaged to form a single composite (i.e. integrated/average) image of the region. A "frame" may hence be understood as a frame of integration or a frame of averaging, generated by the SEM. The feature data estimate for each of the sets of frames may be estimated from/using the respective set of frames, or using a composite image generated from/using the respective set of frames.

As used herein, the term "line edge roughness" (LER) of the one or more features is a measure of a statistical variability of an edge position, along a dimension of the one or more features. The term "linewidth roughness" (LWR) of the one or more features is a measure of a statistical variability of a linewidth, along a dimension of the one or more features. The term "pattern placement roughness" (PPR) of the one or more features is a measure of a statistical variability of the centerline position (midpoint between left and right edges), along a dimension of the one or more features.

The statistical variability of the roughness parameter may be quantified in terms of a variance or a standard deviation (e.g. of an edge position a linewidth of a centerline position for the one or more features). In case of multiple features, the standard deviation a may for example be computed as the square root of the average of the variance ($\sigma^2$) of the individual features. Within the field, LER/LWR/PPR are typically quantified as the 36 (i.e. three times the standard deviation $\sigma$) of the edge positions/linewidths/centerline positions of the one or more features. However, other equivalent measures may also be used, such as one or more standard deviations $\sigma$, or the variance $\sigma^2$.

For a pattern of line-shaped features, each feature may be a line wherein "along a dimension" is to be understood as "along a longitudinal dimension of the line." For a pattern of rounded features (e.g. pillars or via holes), each feature may be a rounded feature wherein "along a dimension" is to be understood as "along a periphery of the feature" (e.g. a periphery of a pillar or a hole edge).

As used herein, the term "model parameter dependent on the number of frames of the set of frames" refers to a model parameter which varies (e.g. monotonically increases) with the number of frames of the set of frames (e.g. the first, second, or third set of frames). The model parameter may simply be the number of frames of the set of frames (i.e. the model parameter is the number of frames of the set of frames), wherein the method may comprise fitting the model equation to the preliminary estimates of the roughness parameter and the respective number of frames of the first, second, and third sets of frames. Alternatively, the model parameter may be a derived parameter, such as an average signal-to-noise ratio (SNR) for the set of frames, wherein the method may comprise fitting the model equation to the preliminary estimates of the roughness parameter and the respective value of the derived parameter for the respective number of frames of the first, second, and third sets of frames (e.g. an average SNR computed for the first, second, and third sets of frames). Unless indicated otherwise, the term "average" will generally be used to refer to the arithmetic mean.

The aspects of the present inventive concept are based on the insight that current metrology protocols, when applied to low-SNR SEM images (wherein SNR tends to increase with the number of frames of integration), lead to an underestimation of typically used roughness parameters, e.g. noise-unbiased roughness parameters such as unbiased line edge roughness (uLER), unbiased linewidth roughness (uLWR), and unbiased pattern placement roughness (uPPR).

It has further been realized that, for a given microstructure pattern (e.g. a pattern in a resist of a given FT), the underestimation decreases with increasing SNR and gradually approaches an asymptotic value representative of the "true" roughness parameter (e.g. uLER, uLWR, or uPPR).

Accordingly, by generating a number of sets of frames (at least three) $S_{i=1,2,3}, \ldots$ of a different number of frames $nbr_i$ (e.g. $nbr_1 < nbr_2 < nbr_3$), estimating respective feature data for each set of frames, computing a respective preliminary estimate of the roughness parameter from the respective feature data, fitting a model equation to the preliminary estimates of the roughness parameter and the model parameter, and extrapolating the fitted model equation to an asymptotic value, an improved accuracy estimate of pattern feature roughness may be obtained also in a low-SNR regime.

The degree of underestimation tends to increase with decreasing SNR (i.e. a smaller number of frames). The merits of the method hence become increasingly relevant when applied to patterns formed using high-NA EUVL in thin or ultra-thin FT resists, such as 30 nm or thinner, although the method is not limited thereto. It is envisaged that the method more generally may be used for performing metrology on further types of microfabrication patterns, such as on etched patterns formed on a substrate.

Since the method enables accurate determination of roughness independently from the SNR of an SEM image, it is further contemplated that the method may be applied to any low-SNR application, for instance if the electron dose and/or number of frames is deliberately limited to reduce an electron dose and a hence a risk of patterning damage.

As used herein, the term "noise-unbiased" (preliminary/final) estimate of a roughness parameter, or for brevity merely "unbiased," is to be understood e.g. as an estimate of the roughness parameter (e.g. LER, LWR, or PPR) computed from feature data for (e.g. estimated from) a set of SEM frames or a (composite) SEM image (generated from the set of SEM frames) so as to remove a bias to the estimate caused by noise in the SEM frames/image. In other words, an unbiased estimate of a roughness parameter is typically considered invariant to noise-induced random errors in feature edge detection. Various techniques for computing unbiased estimates of roughness parameters include techniques based on analysis of the Fourier spectrum, the power spectral density (PSD), or height-height correlation function (HHCF). However, as discussed in further detail below, concepts of this disclosure has been devised based on the insight that some techniques for computing unbiased roughness parameters lack precision in a low SNR regime, and more specifically tend to underestimate the roughness parameters. Accordingly, as used herein, an "unbiased preliminary estimate of a roughness parameter" can be understood as an estimate computed, but which due to a low SNR may not necessarily reflect the "true" unbiased estimate one would estimate in a high SNR regime (the deviation from the "true" estimate being dependent on the SNR in the SEM frames/image). Meanwhile, the "final estimate" can correspond to the unbiased estimated roughness one would expect using techniques in a higher SNR regime, i.e. an SNR-independent unbiased roughness estimate.

As noted above, the preliminary estimate of the roughness parameter may be a noise-unbiased preliminary estimate of the roughness parameter.

In some embodiments, the method may further comprise, for each of the first, second, and third set of frames: computing a spatial frequency density representation from the feature data, estimating a noise floor of the spatial frequency density representation, and computing the noise-unbiased preliminary estimate of the roughness parameter from the spatial frequency density representation and the noise floor.

A spatial frequency density representation allows the variation (i.e. "roughness") in the feature data (e.g. line edge position, linewidth, or centerline position) to be represented as a function of the spatial frequency (i.e. the inverse of the wavelength or magnitude of the variation).

A spatial frequency density representation further allows a noise floor in the feature data to be potentially estimated as a high-frequency portion of the spectrum, so that an unbiased preliminary estimate of the roughness parameter may be estimated.

The computation of the preliminary estimate of the noise-unbiased estimate of the roughness parameter may comprise computing a noise-unbiased spatial frequency density representation by subtracting the noise floor from the spatial frequency density representation and integrating the noise-unbiased spatial frequency density representation.

Alternatively, the computation of the preliminary estimate may comprise integrating the spatial frequency density representation to obtain a noise-biased estimate of the roughness parameter and subtracting a noise floor estimate (e.g. a value of the estimated noise floor) from the noise-biased estimate.

The spatial frequency density representation may be the Fourier spectrum or the power spectral density (PSD) of the feature data.

In case of multiple features, a respective spatial frequency density representation (e.g. a Fourier spectrum or a PSD), may be computed for feature data relating to each individual feature. A common/average spatial frequency density representation may subsequently be computed for the feature data of the features as an average of the respective spatial frequency density representations (e.g. an average of the individual Fourier spectrums or PSDs). The preliminary estimate of the noise-unbiased estimate of the roughness parameter for each respective set of frames may subsequently be computed from the common/average spatial frequency density representation and the noise floor thereof.

In some embodiments, the method may further comprise, for each of the first, second, and third set of frames, generating a respective composite image as a pixel-wise average of the respective set of frames. The feature data may thereafter be estimated using the respective composite image. The process of generating a composite image may be referred to as frame integration or frame averaging. Integrating/averaging a set of frames may yield a composite image with improved SNR and thus in turn enable a more accurate estimation of feature data.

The composite images may be generated by the SEM, wherein the method may comprise receiving (e.g. by the computing device) a first composite image generated from the first set of frames, a second composite image generated from the second set of frames and a third composite image generated from the third set of frames. The composite images may alternatively be generated by the computing device (of the first aspect), or as part of the method implemented by the instructions of the non-transitory computer-readable media (of the second aspect). In either of these alternatives, the method may comprise (e.g. by the computing device) estimating feature data for the first set of frames using the first composite image, estimating feature data for the second set of frames using the second composite image, and estimating feature data for the third set of frames using the third composite image.

The method may comprise estimating feature data for each of the one or more features in the composite image. Accordingly, in line with the above discussion, in case of multiple features, a respective spatial frequency density representation (e.g. a Fourier spectrum or a PSD), may be computed for feature data relating to each individual feature, the feature data being estimated from the composite image.

In embodiments wherein the model parameter is an average signal-to-noise ratio, the average signal-to-noise ratio for a respective set of frames may be an average signal-to-noise ratio of the respective composite image.

The average signal-to-noise ratio of the respective composite image may be computed from an average line scan of the composite image.

In some embodiments, the model equation may be an exponential function. An exponential fitting function corresponds well with the relationship between the roughness parameter and number of frames or SNR indicated by experimental data.

In some embodiments, the model equation may be $Y=a$ $(1-b*e^{c*x})$, where Y is the roughness parameter, x is the model parameter, and a, b, c are fitting parameters. A model equation of this form enables an accurate estimation of the roughness parameter (e.g. uLER, uLWR, or uPPR) based on data points derived from the first, second and third sets of frames.

In some embodiments, the model equation may be a power law equation, e.g. $Y=a-b*c^{x}$, where Y is the roughness parameter, x is the model parameter, and a, b, c are fitting parameters.

In some embodiments, the number of frames of the first set of frames may be less than 8, and the numbers of frames of the second and third sets of frames may each be equal to or greater than 8. By limiting the number of frames of the first set to less than 8, the electron dose exposure for the microfabrication pattern may be reduced and thus reduce a risk of damaging the pattern. A number of frames of less than 8 further allows the first set of frames (and where applicable the first composite image) to be obtained in a low SNR-regime, thus contributing to a stable fitting of the model equation.

In some embodiments, the first, second, and third regions may be different regions of the pattern. Distributing SEM measurements over different regions of the pattern may reduce a risk of causing damage to the pattern, by distributing the total electron dose exposure over a greater area of the pattern. In this case, it is to be understood that each of the regions comprise a respective set of one or more corresponding/like features of the pattern.

In some embodiments, the method may comprise generating by the SEM (first aspect):

a first superset of a plurality of first sets of frames, each first set of frames having a first number of frames and representing a different respective first region of the pattern, a second superset of a plurality of second sets of frames, each second set of frames having a second number of frames and representing a different respective second region of the pattern, and a third superset of a plurality of third sets of frames, each third set of frames having a third number of frames and representing a different respective third region of the pattern.

The method may accordingly comprise, for each superset, computing a preliminary estimate of the roughness parameter as an average of a respective preliminary estimate of the roughness parameter computed from feature data estimated for each set of frames of the superset.

The method may further comprise fitting the model equation to the preliminary estimates of the roughness parameter computed for each respective superset, the model parameter being dependent on the number of frames of the sets of frames of each respective superset.

Thereby, each data point used in the model fit may be based on feature data from a plurality of different regions of the pattern, thus enabling more accurate metrology, while reducing a risk of causing damage to the pattern by distributing the electron does exposure over a greater area of the pattern.

In embodiments comprising frame integration/averaging to form composite images, the method may comprise, for each set of frames of each superset, generating a respective composite image as a pixel-wise average of the respective set of frames, and estimating the feature data using the respective composite image.

In embodiments wherein the model parameter is an average signal-to-noise ratio, the average signal-to-noise ratio for a respective set of frames may be an average signal-to-noise ratio of the composite images generated for each respective superset.

This discussion of supersets applies correspondingly to the computer-readable media (second aspect). Accordingly, in embodiments of the second aspect, the method may comprise, for each superset of:

a first superset of a plurality of first sets of frames, each first set of frames having a first number of frames and representing a different respective first region of the pattern, a second superset of a plurality of second sets of frames, each second set of frames having a second number of frames and representing a different respective second region of the pattern, and a third superset of a plurality of third sets of frames, each third set of frames having a third number of frames and representing a different respective third region of the pattern:

computing a preliminary estimate of the roughness parameter as an average of a respective preliminary estimate of the roughness parameter computed from feature data estimated for each set of frames of the superset, and fitting the model equation to the preliminary estimates of the roughness parameter computed for each respective superset, the model parameter being dependent on the number of frames of the sets of frames of each respective superset.

BRIEF DESCRIPTION OF THE FIGURES

The above, as well as additional, features will be better understood through the following illustrative and non-limiting detailed description of example embodiments, with reference to the appended drawings.

FIG. 2 is a flow chart of a method for performing metrology, according to an example.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A metrology system 100 and method 200 for performing metrology on a microfabrication pattern will now be described in detail with reference to FIG. 1 and FIG. 2.

Figure 1:
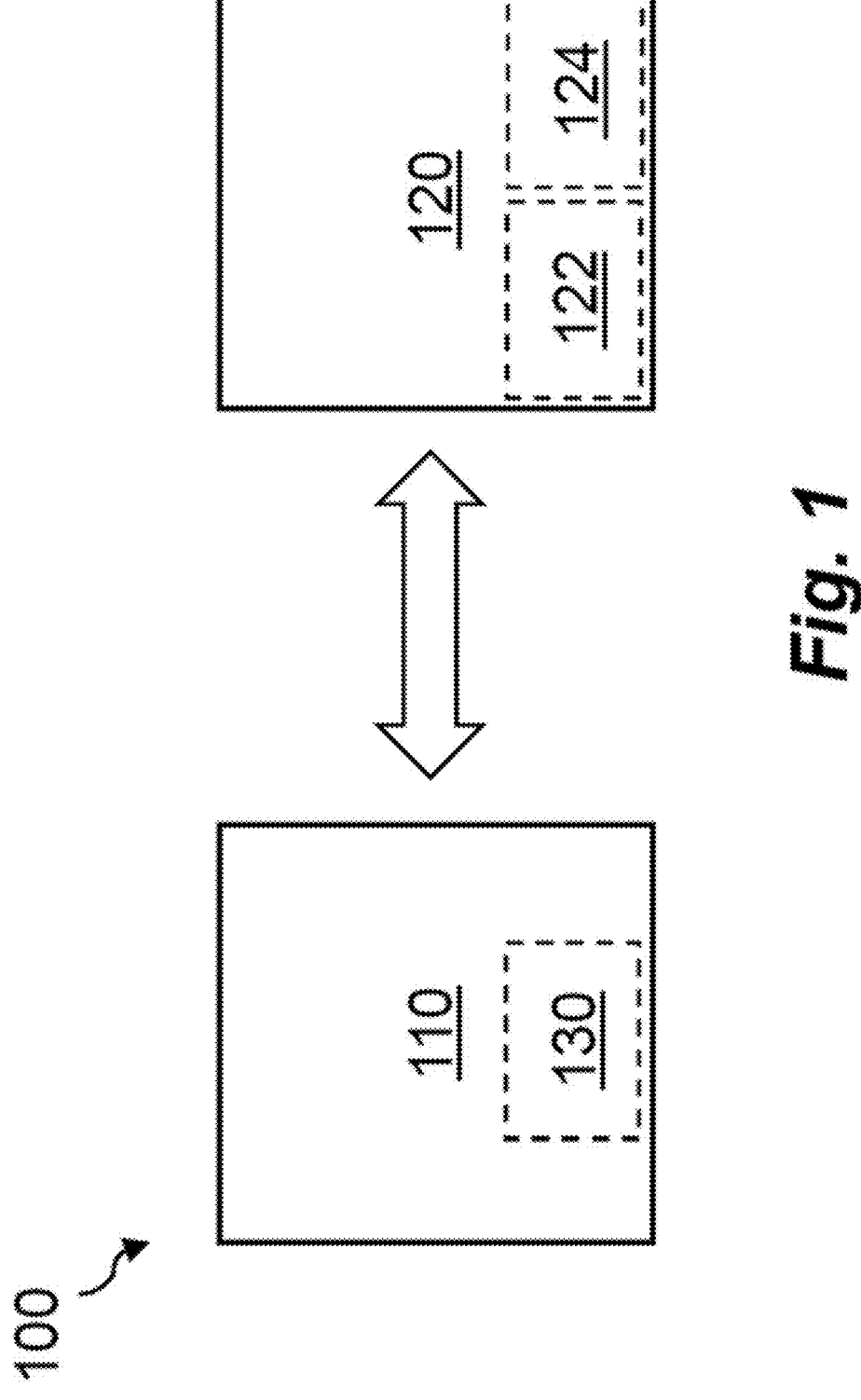
FIG. 1 is a schematic illustration of a metrology system, according to an example.

FIG. 1 schematically illustrates a metrology system 100 comprising a SEM 110 and a computing device 120. The SEM 110 may be a conventional SEM, for instance a critical dimension scanning electron microscope (CDSEM). The SEM 110 may by way of example comprise a vacuum chamber for receiving a sample comprising the microfabrication pattern 130 to be characterized, and an electron source for forming an electron beam. The SEM 110 may further comprise focusing lenses and scanning coils for focusing and scanning the electron beam across the sample in a region of interest, e.g. in a raster scan pattern. An electron detector of the SEM 110 may generate a pixel value (e.g. grayscale) corresponding to the number of back-scattered electrons detected at each scanning position to generate a frame (i.e. a digital image frame). A set of frames may be generated of a same region and combined into a composite image by performing frame integration/averaging of the set of frames.

The microfabrication pattern 130 may for instance be a resist pattern formed on a substrate, or an etched pattern formed on a substrate, e.g. etched via EUVL such as high-NA EUVL. However, the methods described herein may also be used for performing metrology on patterns formed with non-EUVL based lithography techniques (e.g. deep ultraviolet), as well as other types microfabrication patterns.

To facilitate understanding, the patterns will in the following be assumed to be line-shaped, i.e. a pattern of one or more line-shaped features (e.g. protruding material lines or trenches in a layer on the substrate) extending in parallel along a substrate. However, the method may also be used to perform metrology on pattern features of other shapes, such as rounded features (e.g. pillars or via holes). In either case, the pattern may be a regular pattern (e.g. a regular line pattern). Thus, each of the regions of which SEM images/frames are generated may include a same or corresponding pattern (e.g. lines with corresponding orientation, line width, and spacing).

Figure 5:
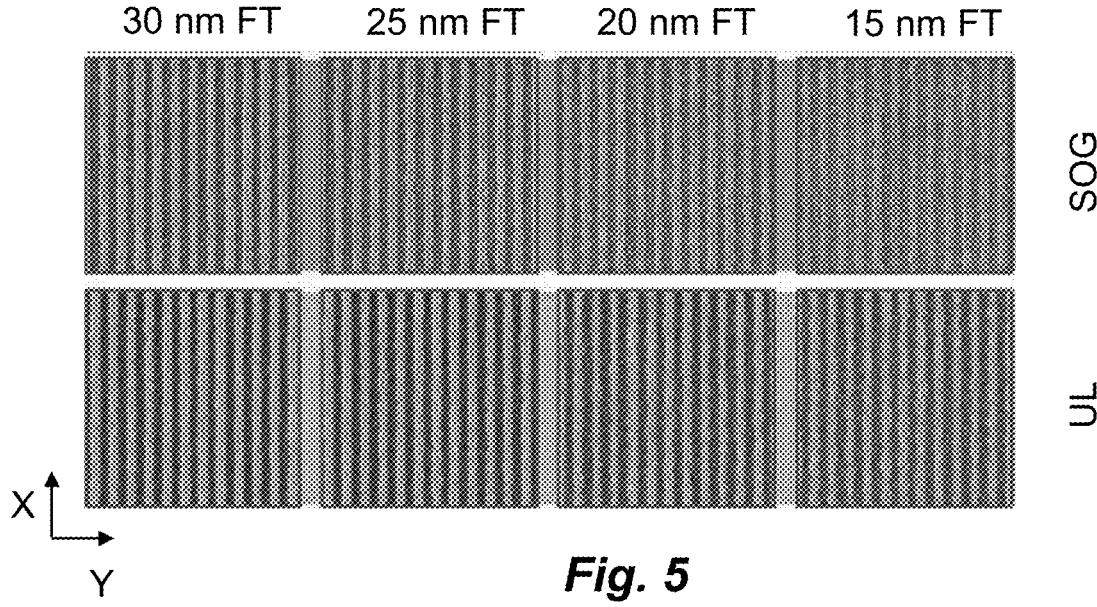
FIG. 5 shows SEM images, according to an example.

Each SEM scan line (and thus each row of pixels of each frame) may conveniently be oriented across and transverse to the features (e.g. lines) of the pattern, wherein each frame/image may be generated such that each column of pixels of the frame/image is oriented along a longitudinal dimension of the features and each row of pixels is oriented across and transverse to the features, e.g. as shown in FIG. 5. In other words, each row of pixels of a frame/image may correspond to a respective scan line across the features of the imaged region. Optionally, the computing device 120 may apply a rotational transform to each frame/image as a pre-processing step to orient the imaged features along the column dimension Y if a different scan line orientation has been used. The orientation of the pattern with respect to the frame/image dimensions is however arbitrary and the processing to be described below may also be applied to frames/images with features oriented along the Y-dimension.

The data analysis of the present method (e.g. estimation of feature data and roughness parameters) may be implemented by the computing device 120. The computing device 120 may comprise processing circuitry configured to implement the method. The computing device 120 may for instance comprise one or more processors 122 and the operations of the method may be implemented using software instructions which may be stored on a computer readable media 124 (e.g. on a non-transitory computer readable storage medium) to be executed by the one or more processors 122 of the computing device 120. The computing device 120 may for example be a personal computer (e.g. a laptop or desktop computer). The computing device 120 may alternatively comprise dedicated circuitry configured to implement the method, such as one or more integrated circuits, one or more application-specific integrated circuits (ASICs) or field-programmable gate arrays (FPGAs).

In FIG. 1 the computing device 120 is shown to be separate from the SEM 110 and coupled to the SEM 110 over a communications interface (e.g. a serial or parallel interface or a network) to receive data (e.g. frames/images) from the SEM 110, and optionally transmit control parameters to the SEM 110 (e.g. parameters for setting pixel size, beam current, frame/image resolution, the number of frames of integration, coordinates for the region to be scanned, etc.) The computing device 120 may however also form part of the SEM 110, such that the computing device 120 of the SEM 110 may compute and output the final estimate of the roughness parameter to an external device, e.g. a computer or a display device connected to the SEM 110.

FIG. 2 depicts a flow chart of the method 200. In step S202, the SEM 110 generates a number of sets of frames $S_i = \{F_{i,1}, F_{i,2}, \ldots, F_{i,nbr_i}\}$ of the microfabrication pattern 130. A set of frames $S_i$ may for brevity in the following also be referred to as a frame set $S_i$. Each frame set $S_i$ comprises or consists of a respective number of frames $nbr_i$, which is different for each frame set $S_i$. The number of frame sets $S_i$ may generally be selected in dependency of the number of data points needed to ensure a stable fitting of a model equation (described below) and may by way of example be 3, 4, 5 or greater. However, according to the method at least 3 frame sets $S_{i=1,2,3}, \ldots$ can be generated, i.e. a first frame set $S_i$ of $nbr_1$ frames, a second frame set $S_2$ of $nbr_2$ frames, and a third frame set $S_3$ of $nbr_3$ frames, wherein $nbr_1 < nbr_2 < nbr_3$.

The frames $F_{i,j}$ of each frame set $S_i$ are generated or acquired from, and thus represent or image, a same region $R_i$ of the microfabrication pattern 130 under investigation. Each frame set $S_i$ may represent a different region $R_i$ of the pattern 130.

While the number of frames $nbr_i$ of the frame sets $S_i$ are different (and optionally also the regions $R_i$ each frame set depict), it is to be understood that other acquisitions parameters may be kept constant between the frame sets $S_i$. Variations in parameters other than number of frames/SNR between the frame sets could otherwise complicate data analysis and render the metrology more challenging. SEM acquisition parameters which may be the same among the frame sets $S_i$ include acceleration voltage, probe current, pixel size, and magnification.

In step S204, each frame set $S_i$ is received by the computing device 120 and for each frame set $S_i$ (e.g. each of the first frame set $S_i$, the second frame set $S_2$, and the third frame set $S_3$) the computing device 120: estimates feature data and computes a preliminary estimate of a roughness parameter from the feature data (step S206 and sub-steps S206a, S206b). A preliminary estimate of a roughness parameter may for brevity in the following also be referred to as a preliminary roughness estimate.

The estimation of the feature data may comprise estimating feature data representing one or more of edge positions, linewidths, or centerline positions of each feature of the region $R_i$ represented in the frames $F_{i,j}$ of the frame set $S_i$.

The feature data may comprise edge data representing, for each feature in the region $R_i$, a position of the edge (left and/or right) of the feature for each scan line or pixel row position along the feature. For a line-shaped feature, the edge position may be indicated as a deviation from a nominal edge position, e.g. an average position of the feature edge.

The feature data may additionally or alternatively comprise linewidth data, for each feature in the region $R_i$, a linewidth (a difference between left and right edge positions) of the feature for each scan line or pixel row position along the feature.

The feature data may additionally or alternatively comprise centerline data, for each feature in the region $R_i$, a centerline position (a midpoint between left and right edge positions) of the feature for each scan line or pixel row position along the feature. For a line-shaped feature, the centerline position may be indicated as a deviation from a nominal centerline position, e.g. an average centerline position of the feature.

Any suitable conventional image processing technique for edge detection may be used for estimating the feature data. From the edge data, the computing device 120 may compute a preliminary estimate of the line edge roughness (LER). From the linewidth data, the computing device 120 may compute a preliminary estimate of the line width roughness (LWR). From the centerline data, the computing device 120 may compute a preliminary estimate of the pattern placement roughness (PPR). More specifically, the computing device 120 may compute a noise-unbiased preliminary roughness estimate (i.e. uLER, uLWR or uPPR), as will be described in further detail below.

In step 208, the method 200 proceeds by the computing device 120 fitting a model equation to the preliminary estimates of the roughness parameter (e.g. uLER, uLWR or uPPR) using a model parameter dependent on the number of frames of the set of frames. The model equation may be:

$$Y=a(1-b*e^{c*x}) \tag{Eq. 1}$$

where Y is the roughness parameter (e.g. uLER, uLWR or uPPR), x is the model parameter and a, b, c are fitting parameters. The model parameter x may be the number of frames nbr_i of the respective frame sets $S_i$, or a respective average SNR for the respective the respective frame sets $S_i$, or some other derived parameter increasing with nbr_i.

An average SNR for a respective frame set $S_i$ may be estimated in various manners. An average SNR may be estimated for each frame $F_{i,j}$ of the frame set $S_i$, wherein the average SNRs of the frame $F_{i,j}$ in turn may be averaged to obtain the average SNR for the frame set $S_i$. An average SNR may also be estimated by generating a composite image $I_i$ by frame integration over the set of frames $F_{i,j}$ (see Eq. 3 below) and subsequently estimating an average SNR of the image $I_i$. An average SNR of an image $I_i$ (and correspondingly for a frame $F_{i,j}$) may be estimated using a ratio of a difference between a (grayscale) maximum ($P_{max}$) and minimum ($P_{in}$) intensity of an average pixel row of the rows of pixels of the image $I_i$, and a grayscale noise level. A grayscale noise level may be estimated from a non-feature edge portion of the image $I_i$ (e.g. the $1\sigma$ noise noise). Eq. 2 provides an example equation for computing an average SNR:

$$\text{Average } SNR = \frac{P_{max} - P_{min}}{\text{Grayscale noise}(1\sigma)} \tag{Eq. 2}$$

In case the method involves processing supersets $\{S_i\}_m$, of frame sets $S_i$ with a same number of frames (discussed below), the average pixel row may be computed over the rows of pixels of each image $I_i$ associated with the superset $\{S_i\}m$, and the grayscale noise level may be computed as the average of the $1\sigma$ grayscale noise of each image $I_i$ associated with the superset $\{S_i\}_m$, so as to yield an average SNR for the superset $\{S_i\}_m$.

A model equation of the form exemplified by Eq. 1 enables an accurate estimation of the roughness parameter based on only three data points. However it is contemplated that other types of model equations may be used, such as other exponential functions or a power law. An example form of a power law equation is $Y=a-b*c^x$, with the same parameter definitions as provided in connection with Eq. 1.

After performing the model fit, the computing device 120 in step S210 computes a final estimate of the roughness parameter as an asymptotic value of the fitted model equation. The asymptotic value may be obtained by extrapolating the fitted model equation Y(x). The asymptotic value may for example be computed as the value of x at which the curvature of Y(x) (e.g. the first order derivate of the model equation dY/dx) becomes smaller than a predetermined threshold. The asymptotic value may also be obtained by plotting Y(x) and identifying a value of x at which Y(x) approaches a plateau value.

Figure 3:
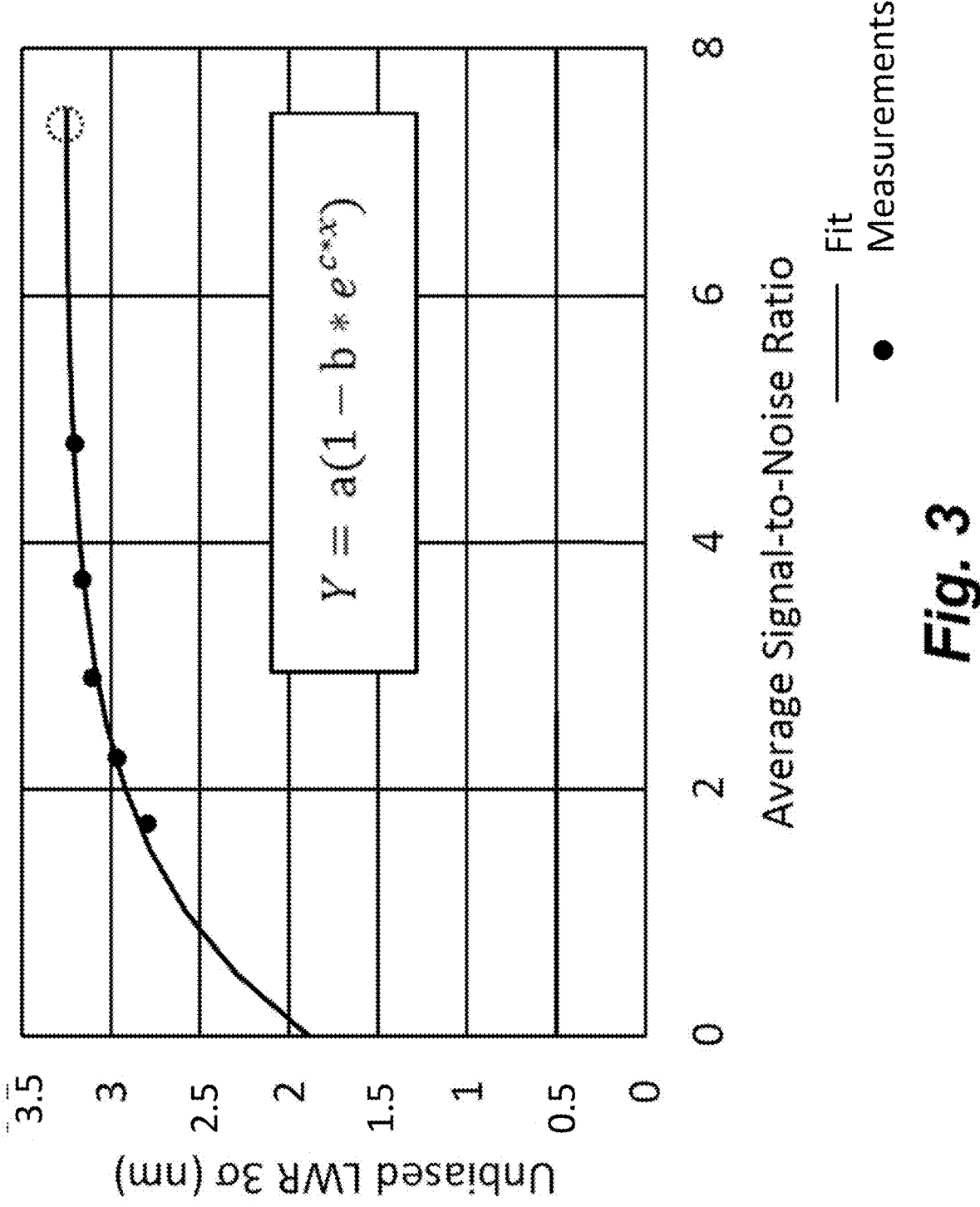
FIG. 3 shows fitting a model equation, according to an example.

FIG. 3 schematically depicts the result of fitting the model equation Y to a data set of 5 data points, i.e. 5 preliminary estimates of a roughness parameter (e.g. uLWR) computed for 5 frame sets $S_i$ as a function of average SNR for the respective frame sets $S_i$. The dashed circle represents an example of the final estimate of the roughness parameter (e.g. uLWR).

For improved robustness of the estimation of the feature data, the computing device 120 may, rather than estimating feature data from the individual frames $F_{i,j}$ of each frame set $S_i$, estimate the feature data from a composite image $I_i$ generated by performing frame integration on the frame set $S_i$ (S205). That is, the SEM 110 or the computing device 120 may, for each frame set $S_i$, generate a respective composite image $I_i$ as a pixel-wise average of the respective frames $F_{i,j}$ of each respective frame set $S_i$, i.e.

$$I_i = \frac{\sum_j F_{i,j}}{nbr_i} \tag{Eq. 3}$$

where the summation is to be understood as a pixel-wise summation of corresponding pixels of the frames $F_{i,j}$. The image $I_i$ and the frames $F_{i,j}$ of each frame set $S_i$ may thus have the same dimensions. The computing device 120 may for each image $I_i$ estimate one or more of the aforementioned types of feature data and compute a respective preliminary roughness estimate for each image $I_i$. If the composite images are generated by the SEM 110, the computing device 120 may receive the composite images $I_i$ from the SEM 110 (e.g. as an alternative to receiving to the individual frames of the frame sets $S_i$).

Figure 4:
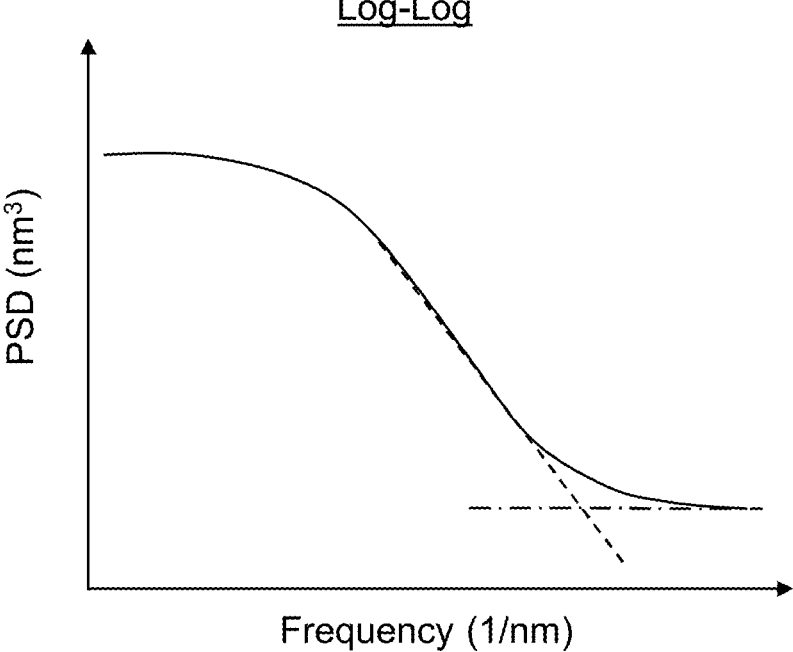
FIG. 4 shows a power spectral density of feature data, according to an example.

A noise-unbiased estimate of a roughness parameter (e.g. uLWR, uLER or uPPR) for an image $I_i$ (generated from frame set $S_i$) may be determined through an unbiasing procedure in which a (one-dimensional) power spectral density (PSD) is used to determine the SEM noise floor in the image $I_i$. The noise floor may subsequently be subtracted from the (noise-biased) PSD to obtain the unbiased PSD. The unbiased roughness estimate may be obtained by integrating the unbiased PSD. Alternatively, the (noise-biased) PSD may be integrated to obtain a noise-biased roughness estimate wherein the unbiased roughness estimate may be obtained by subtracting the noise floor. The noise floor may be estimated from the high-frequency portion of the PSD. FIG. 4 illustrates an example Log-Log plot of the PSD as a function of the spatial frequency of feature data (e.g. edge data, linewidth data, or centerline data) for a feature, e.g. estimated from an image $I_i$. The full line represents the biased PSD. The dash-dotted line represents the noise floor of the SEM frames/image. The dashed line represents the noise-unbiased PSD. The integral of the unbiased PSD corresponds to an estimate of the variance $\sigma^2$ of the feature data. uLWR, uLER or uPPR may then be computed as 3 times the square root of the integral value ($3\sqrt{\sigma^2}$).

In case of multiple features, an improved significance level of the preliminary estimate may be provided by estimating feature data for each individual feature k in the image computing a respective PSD ($PSD_k$) for the feature data relating to each individual feature k, and thereafter computing a common/average PSD ($\overline{PSD}$) for the feature data estimated from the image $I_i$ as an average of the respective PSDs, e.g.

$$\overline{PSD} = \frac{\sum_k PSD_k}{\text{number of features in image } I_i} \tag{Eq. 4}$$

The preliminary estimate of the noise-unbiased estimate of the roughness parameter for each respective set of frames may subsequently be computed from the average PSD ($\overline{PSD}$) and the noise floor thereof and by integrating the resulting unbiased average PSD.

While a PSD is a convenient tool for characterizing a feature roughness, it is contemplated that also other types of spatial frequency density representations may be used, such as the Fourier spectrum.

Further techniques for unbiased roughness estimates include the approach based on the HHCF, as described by Constantoudis et al in "Toward a complete description of linewidth roughness: a comparison of different methods for vertical and spatial LER and LWR analysis and CD variation" (Proceedings of SPIE Vol. 5375 pages 967-977).

As discussed above, unbiased roughness estimates may be computed based on feature data (edge position, linewidth, or centerline position) estimated from the respective composite images $I_i$. Unbiased roughness estimates may however also be computed based on feature data estimated from the individual frames $F_{i,j}$ of a frame set $S_i$. An example of such a technique is described by Villarrubia et al in "Unbiased estimation of linewidth Roughness" (Proceedings of SPIE Vol. 5752, Metrology, Inspection, and Process Control for Microlithography XIX, 10 May 2005). Another example would be to compute a respective PSD for a feature k in each frame $F_{i,j}$ of a frame set $S_i$, and then compute an average PSD for the feature k by averaging the respective PSDs. In line with the above discussion, this may be repeated for each feature in the frame set $S_i$, wherein the average PSDs for the features k then may be averaged to compute the PSD for the frame set $S_i$.

As may be appreciated from the above, the significance level of the roughness estimates (preliminary and final) is dependent on the amount of feature data. One approach for increasing the amount of feature data is to, for each data point to be used in the model fit (e.g. step S208), generate a number of (e.g. two or more) frame sets $S_i$ with a same number of frames nbr_i and representing a different respective region of the pattern. Accordingly, the SEM may generate a number of supersets $\{S_{i,m}\}_m$ of frame sets $S_{i,m}$ (wherein the additional index m is introduced to distinguish between frame sets of different supersets) wherein each frame set $S_{i,m}$ of a superset $\{S_i\}_m$ has a same number of frames $nbr_{i,m}$. The methods and data processing described above may accordingly be applied in a corresponding manner to each frame of each frame set $S_{i,m}$ of $\{S_i\}_m$, and/or each image $I_{i,m}$ generated from the frame set $S_{i,m}$ (and thus being associated with $\{S_i\}_m$).

For example, a number of supersets $\{S_i\}_m$ of frame sets $S_{i,m}$ may be generated by the SEM 110 and received by the computing device 120 (S202-S204). An image may be generated from each frame set $S_{i,m}$ of each superset $\{S_i\}_m$ (S205). Feature data may be estimated for each feature in each image (S206a) and a preliminary roughness estimate may be computed from the feature data estimated from each image associated with the superset $\{S_i\}_m$ (S206b). The model equation may subsequently be fitted to the respective preliminary roughness estimates for the supersets $\{S_i\}_m$ and the model parameter (e.g. the number of frames $nbr_{i,m}$ or the average SNR).

If a PSD-based approach is used, an average PSD may be computed for each superset $\{S_i\}_m$. For example, a respective PSD may be computed for each feature of each image associated with the superset $\{S_i\}_m$ and an average PSD for each image $I_{i,m}$ may be computed by averaging the respective PSDs computed for the features of the image $I_{i,m}$. Once an average PSD has been computed for each image $I_{i,m}$ associated with the superset $\{S_i\}_m$, a final (biased) PSD may be computed as an average over the average PSDs for each image $I_{i,m}$ associated with the superset $\{S_i\}_m$. A single preliminary roughness estimate may then be computed from the final average PSD for the superset $\{S_i\}_m$ and a noise floor thereof, using either of the approaches described above.

FIG. 5 shows example SEM images of wafers with patterned thin resist films, more specifically, chemically amplified resists (CAR), coated on a spin-on-glass (SOG) and an organic underlayer (UL). The X-axis and the Y-axis indicate the pixel column and pixel row directions, respectively.

The film thickness (FT) of the resist films were 30 nm, 25 nm, 20 nm, and 15 nm. The films were exposed in an ASML full-field NXE:3400 scanner to print vertical 1:3 lines and spaces at a pitch of 32 nm. Subsequently, the wafers received a post-exposure bake of 90° C. for 60 seconds and were developed with a 2.38% tetramethyl-ammonium hydroxide (TMAH) solution.

The SEM images were obtained with a Hitachi CG-6300 CDSEM. Although the SEM images in the different rows differ, the trend of a reduced overall image contrast as the FT is reduced may be readily seen for both types of underlayers.

For each wafer, 50 images were generated (84K, 2048×2048 pixels) at the best dose best focus condition (BD-BF) at a variable number of CDSEM frames of integration (e.g., 4, 8, 16, 32, or 64). For a given wafer, this corresponds to 5 supersets $\{S_{i,m}\}_{m=1,2,\ldots,5}$, each comprising 50 frame sets $S_{i,m}$ (i=1,2, . . . , 50) of $nbr_{i,m}$ frames $F_{i,j,m}$ each ($nbr_{i,1}$=4, $nbr_{i,2}$=8, $nbr_{i,3}$=16, $nbr_{i,4}$=32, $nbr_{i,5}$=64), and generating a composite image km for each frame set $S_{i,m}$.

For each wafer, and for each frame number (i.e. each superset $\{S_{i,m}\}_{m=1,2,\ldots,5}$), the unbiased LWR (3σ) was determined for the set of 50 images km associated with the respective superset, and the average SNR was estimated using Eq. 2.

Figure 6:
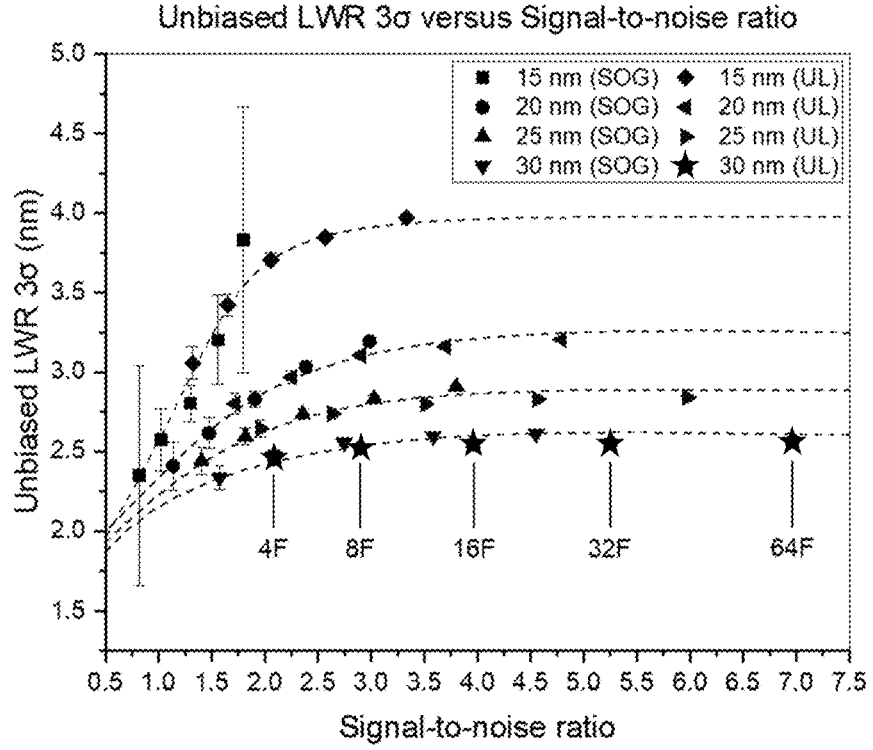
FIG. 6 shows the results of metrology performed on the patterns shown in FIG. 5, according to an example.

FIG. 6 shows a plot of the resulting data points for each of the wafers, wherein a model equation of the form shown in Eq. 1 has been fitted to the data points associated with each wafer and superset. The fact that the estimated unbiased LWR changes with SNR is a clear metrology artifact that ideally is avoided. It may be observed that in the limit of small SNR the unbiased LWR is underestimated, while at larger SNR the unbiased LWR asymptotically approaches a stable realistic value. Plots of unbiased LER versus SNR and unbiased PPR versus SNR show a corresponding relationship. This applies also to plots of unbiased LER/LWR/PPR versus number of frames of integration.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method comprising:
    transmitting control parameters to a scanning electron microscope;
    generating, by the scanning electron microscope and according to the control parameters, a first set of frames of a first region of a microfabrication pattern, a second set of frames of a second region of the microfabrication pattern, and a third set of frames of a third region of the microfabrication pattern, wherein a number of frames of the first set, the second set and the third set are different;

estimating, using the first set, the second set, and the third set, first feature data corresponding to the first set, second feature data corresponding to the second set, and third feature data corresponding to the third set, wherein the first feature data, the second feature data, and the third feature data represent edge positions, linewidths, or centerline positions of features of the microfabrication pattern;

computing a first preliminary estimate, a second preliminary estimate, and a third preliminary estimate of a roughness parameter from the first feature data, the second feature data, and the third feature data, wherein the roughness parameter is indicative of a line edge roughness, a linewidth roughness, or a pattern placement roughness of the features of the microfabrication pattern;

fitting a model equation to the first preliminary estimate, the second preliminary estimate, and the third preliminary estimate using a model parameter that is dependent on the number of frames of the first set, the second set, or the third set, the model equation relating the model parameter to the roughness parameter, wherein the model parameter is an average signal-to-noise ratio for the first set, the second set, or the third set; and computing a final estimate of the roughness parameter using the model equation.

2. The method according to claim 1, wherein the roughness parameter is one or more standard deviations of an edge position of the microfabrication pattern.

3. The method according to claim 1, wherein the roughness parameter is one or more standard deviations of a linewidth of the microfabrication pattern.

4. The method according to claim 1, wherein the roughness parameter is one or more standard deviations of a centerline position of the microfabrication pattern.

5. The method according to claim 1, wherein the first preliminary estimate, the second preliminary estimate, and the third preliminary estimate of the roughness parameter are noise-unbiased preliminary estimates of the roughness parameter.

6. The method according to claim 5, further comprising:

computing a spatial frequency density representation from the first feature data, and estimating a noise floor of the spatial frequency density representation, wherein computing the first preliminary estimate comprises computing the first preliminary estimate using the spatial frequency density representation and the noise floor.

7. The method according to claim 6, wherein computing the first preliminary estimate further comprises:

computing a noise-unbiased spatial frequency density representation by subtracting the noise floor from the spatial frequency density representation; and integrating the noise-unbiased spatial frequency density representation.

8. The method according to claim 6, wherein computing the first preliminary estimate further comprises:

integrating the spatial frequency density representation to obtain a noise-biased estimate of the roughness parameter; and subtracting the noise floor from the noise-biased estimate.

9. The method according to claim 6, wherein the spatial frequency density representation is a Fourier spectrum or a power spectral density.

10. The method according to claim 1, further comprising, generating a first composite image as a pixel-wise average of the first set of frames, a second composite image as a pixel-wise average of the second set of frames, and a third composite image as a pixel-wise average of the third set of frames, wherein estimating the first feature data, the second feature data, and the third feature data comprises estimating the first feature data using the first composite image, estimating the second feature data using the second composite image, and estimating the third feature data using the third composite image.

11. The method according to claim 1, wherein the model parameter is equal to the number of frames of the first set, the second set, or the third set.

12. The method according to claim 1, wherein the model equation is an exponential function.

13. The method according to claim 12, wherein the model equation is $Y=a(1-b*e^{c*x})$, wherein Y is the roughness parameter, x is the model parameter, and a, b, c are fitting parameters.

14. The method according to claim 1, wherein the number of frames of the first set is less than 8, and wherein the numbers of frames of the second set and the third set are each equal to or greater than 8.

15. The method according to claim 1, wherein the microfabrication pattern is a resist pattern formed on a substrate.

16. The method according to claim 1, wherein the microfabrication pattern is an etched pattern formed on a substrate.

17. The method of claim 1, wherein transmitting the control parameters comprises transmitting the control parameters such that the control parameters comprise one or more of a pixel size, a beam current, a frame resolution, or a number of frames to be integrated.

18. The method of claim 1, wherein transmitting the control parameters comprises transmitting the control parameters such that the control parameters comprise coordinates indicating the first region, the second region, and the third region.

19. A non-transitory computer-readable media storing instructions that, when executed by a computing device, cause the computing device to perform functions comprising:

transmitting control parameters to a scanning electron microscope;

generating, by the scanning electron microscope and according to the control parameters, a first set of frames of a first region of a microfabrication pattern, a second set of frames of a second region of the microfabrication pattern, and a third set of frames of a third region of the microfabrication pattern, wherein a number of frames of the first set, the second set and the third set are different;

estimating, using the first set, the second set, and the third set, first feature data corresponding to the first set, second feature data corresponding to the second set, and third feature data corresponding to the third set, wherein the first feature data, the second feature data, and the third feature data represent edge positions, linewidths, or centerline positions of features of the microfabrication pattern;

computing a first preliminary estimate, a second preliminary estimate, and a third preliminary estimate of a roughness parameter from the first feature data, the second feature data, and the third feature data, wherein the roughness parameter is indicative of a line edge roughness, a linewidth roughness, or a pattern placement roughness of the features of the microfabrication pattern;

fitting a model equation to the first preliminary estimate, the second preliminary estimate, and the third preliminary estimate using a model parameter that is dependent on the number of frames of the first set, the second set, or the third set, the model equation relating the model parameter to the roughness parameter, wherein the model parameter is an average signal-to-noise ratio for the first set, the second set, or the third set; and computing a final estimate of the roughness parameter using the model equation.

20. A computing device comprising:

a processor; and a computer readable medium storing instructions that, when executed by the processor, cause the computing device to perform functions comprising:

transmitting control parameters to a scanning electron microscope;

generating, by the scanning electron microscope and according to the control parameters, a first set of frames of a first region of a microfabrication pattern, a second set of frames of a second region of the microfabrication pattern, and a third set of frames of a third region of the microfabrication pattern, wherein a number of frames of the first set, the second set and the third set are different;

estimating, using the first set, the second set, and the third set, first feature data corresponding to the first set, second feature data corresponding to the second set, and third feature data corresponding to the third set, wherein the first feature data, the second feature data, and the third feature data represent edge positions, linewidths, or centerline positions of features of the microfabrication pattern;

computing a first preliminary estimate, a second preliminary estimate, and a third preliminary estimate of a roughness parameter from the first feature data, the second feature data, and the third feature data, wherein the roughness parameter is indicative of a line edge roughness, a linewidth roughness, or a pattern placement roughness of the features of the microfabrication pattern;

fitting a model equation to the first preliminary estimate, the second preliminary estimate, and the third preliminary estimate using a model parameter that is dependent on the number of frames of the first set, the second set, or the third set, the model equation relating the model parameter to the roughness parameter, wherein the model parameter is an average signal-to-noise ratio for the first set, the second set, or the third set; and computing a final estimate of the roughness parameter using the model equation.

\* \* \* \* \*